United States Patent
Jeddeloh

(10) Patent No.: US 7,913,122 B2
(45) Date of Patent: *Mar. 22, 2011

(54) SYSTEM AND METHOD FOR ON-BOARD DIAGNOSTICS OF MEMORY MODULES

(75) Inventor: Joseph M. Jeddeloh, Shoreview, MN (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/346,216

(22) Filed: Dec. 30, 2008

(65) Prior Publication Data

US 2009/0106591 A1    Apr. 23, 2009

Related U.S. Application Data

(63) Continuation of application No. 11/901,486, filed on Sep. 17, 2007, now Pat. No. 7,516,363, which is a continuation of application No. 11/433,130, filed on May 11, 2006, now Pat. No. 7,278,060, which is a continuation of application No. 10/644,522, filed on Aug. 19, 2003, now Pat. No. 7,210,059.

(51) Int. Cl.
*G06F 11/00* (2006.01)
(52) U.S. Cl. ........................................................ 714/42
(58) Field of Classification Search ................ 714/42
See application file for complete search history.

(56) References Cited

U.S. PATENT DOCUMENTS

| | | | |
|---|---|---|---|
| 4,045,781 A | 8/1977 | Levy et al. | 364/200 |
| 4,084,225 A | 4/1978 | Anderson et al. | 364/200 |
| 4,240,143 A | 12/1980 | Besemer et al. | 364/200 |
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,608,702 A | 8/1986 | Hirzel et al. | 375/110 |
| 4,707,823 A | 11/1987 | Holdren et al. | 370/1 |
| 4,724,520 A | 2/1988 | Athanas et al. | 364/200 |
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 5,123,016 A | 6/1992 | Muller et al. | 371/10.3 |

(Continued)

FOREIGN PATENT DOCUMENTS

EP    0849685 A2    6/1998

(Continued)

OTHER PUBLICATIONS

"Free On-Line Dictionary of Computing" entry 'Flash Erasable Programmable Read-Only Memory, online May 17, 2004 [http://foldoc.doc.ic.ac.uk/foldoc/foldoc.cgi?flash+memory].

(Continued)

*Primary Examiner* — Bryce P Bonzo
(74) *Attorney, Agent, or Firm* — Lerner, David, Littenberg, Krumholz & Mentlik, LLP

(57) ABSTRACT

A memory hub includes an on-board diagnostic engine through which diagnostic testing and evaluation of the memory system can be performed. The memory hub includes a link interface for receiving memory requests for access to memory devices of the memory system and a memory device interface coupled to the memory devices for coupling memory requests to the memory devices. A memory hub diagnostic engine is coupled through a switch to the link interface and the memory device interface to perform diagnostic testing of the memory system. The diagnostic engine includes a maintenance port that provides access to results of the diagnostic testing and through which diagnostic testing commands can be received.

4 Claims, 3 Drawing Sheets

U.S. PATENT DOCUMENTS

| | | | |
|---|---|---|---|
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,274,584 A | 12/1993 | Henderson et al. | 365/64 |
| 5,287,343 A | 2/1994 | Nakamura et al. | 370/13.1 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,349,587 A | 9/1994 | Nadeau-Dostie et al. | 371/22.3 |
| 5,355,391 A | 10/1994 | Horowitz et al. | 375/36 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,450,578 A | 9/1995 | Mackenthun | 395/182.02 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,572,722 A | 11/1996 | Vogley | 395/555 |
| 5,577,220 A | 11/1996 | Combs et al. | 395/416 |
| 5,581,482 A | 12/1996 | Wiedenman et al. | 364/551.01 |
| 5,581,767 A | 12/1996 | Katsuki et al. | 395/800 |
| 5,606,717 A | 2/1997 | Farmwald et al. | 395/856 |
| 5,619,676 A | 4/1997 | Fukuda et al. | 395/464 |
| 5,621,739 A | 4/1997 | Sine et al. | 371/22.1 |
| 5,638,334 A | 6/1997 | Farmwald et al. | 365/230.03 |
| 5,659,798 A | 8/1997 | Blumrich et al. | 395/846 |
| 5,706,224 A | 1/1998 | Srinivasan et al. | 365/49 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,768,152 A | 6/1998 | Battaline et al. | 364/551.01 |
| 5,790,048 A | 8/1998 | Hsieh et al. | 340/825.79 |
| 5,793,776 A | 8/1998 | Qureshi et al. | 371/22.1 |
| 5,818,844 A | 10/1998 | Singh et al. | 370/463 |
| 5,819,304 A | 10/1998 | Nilsen et al. | 711/5 |
| 5,822,255 A | 10/1998 | Uchida | 365/194 |
| 5,832,250 A | 11/1998 | Whittaker | 395/471 |
| 5,875,352 A | 2/1999 | Gentry et al. | 395/843 |
| 5,875,454 A | 2/1999 | Craft et al. | 711/113 |
| 5,905,858 A | 5/1999 | Jeddeloh | 395/185.05 |
| 5,912,852 A | 6/1999 | Lawrence et al. | 365/201 |
| 5,914,902 A | 6/1999 | Lawrence et al. | 365/201 |
| 5,928,343 A | 7/1999 | Farmwald et al. | 710/104 |
| 5,959,914 A | 9/1999 | Gates et al. | 365/201 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,023,726 A | 2/2000 | Saksena | 709/219 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,073,190 A | 6/2000 | Rooney | 710/56 |
| 6,076,139 A | 6/2000 | Welker et al. | 711/104 |
| 6,079,008 A | 6/2000 | Clery, III | 712/11 |
| 6,098,158 A | 8/2000 | Lay et al. | 711/162 |
| 6,105,075 A | 8/2000 | Ghaffari | 710/5 |
| 6,125,431 A | 9/2000 | Kobayashi | 711/154 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,173,388 B1 | 1/2001 | Abercrombie et al. | 712/22 |
| 6,175,571 B1 | 1/2001 | Haddock et al. | 370/423 |
| 6,185,352 B1 | 2/2001 | Hurley | 385/114 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,205,564 B1 | 3/2001 | Kim et al. | 714/48 |
| 6,208,180 B1 | 3/2001 | Fisch et al. | 327/141 |
| 6,219,725 B1 | 4/2001 | Diehl et al. | 710/26 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,692 B1 | 7/2001 | Yoda et al. | 710/104 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,347,055 B1 | 2/2002 | Motomura | 365/189.05 |
| 6,349,363 B2 | 2/2002 | Cai et al. | 711/129 |
| 6,351,834 B1 | 2/2002 | Maekawa et al. | 714/718 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,373,777 B1 | 4/2002 | Suzuki | 365/230.03 |
| 6,381,190 B1 | 4/2002 | Shinkai | 365/230.03 |
| 6,392,653 B1 | 5/2002 | Malandain et al. | 345/501 |
| 6,401,213 B1 | 6/2002 | Jeddeloh | 713/401 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,434,639 B1 | 8/2002 | Haghighi | 710/39 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,446,174 B1 | 9/2002 | Dow | 711/154 |
| 6,449,308 B1 | 9/2002 | Knight, Jr. et al. | 375/212 |
| 6,453,393 B1 | 9/2002 | Holman et al. | 711/154 |
| 6,462,978 B2 | 10/2002 | Shibata et al. | 365/63 |
| 6,463,059 B1 | 10/2002 | Movshovich et al. | 370/389 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,487,648 B1 | 11/2002 | Hassoun | 711/167 |
| 6,490,188 B2 | 12/2002 | Nuxoll et al. | 365/63 |
| 6,493,803 B1 | 12/2002 | Pham et al. | 711/147 |
| 6,496,909 B1 | 12/2002 | Schimmel | 711/163 |
| 6,501,471 B1 | 12/2002 | Venkataraman et al. | 345/424 |
| 6,505,287 B2 | 1/2003 | Uematsu | 711/170 |
| 6,523,092 B1 | 2/2003 | Fanning | 711/134 |
| 6,523,093 B1 | 2/2003 | Bogin et al. | 711/137 |
| 6,539,490 B1 | 3/2003 | Forbes et al. | 713/401 |
| 6,552,564 B1 | 4/2003 | Forbes et al. | 326/30 |
| 6,564,329 B1 | 5/2003 | Cheung et al. | 713/322 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,615,325 B2 | 9/2003 | Mailloux et al. | 711/154 |
| 6,622,227 B2 | 9/2003 | Zumkehr et al. | 711/167 |
| 6,625,702 B2 | 9/2003 | Rentschler et al. | 711/154 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,636,110 B1 | 10/2003 | Ooishi et al. | 327/565 |
| 6,646,929 B1 | 11/2003 | Moss et al. | 365/194 |
| 6,658,509 B1 | 12/2003 | Bonella et al. | 710/100 |
| 6,662,304 B2 | 12/2003 | Keeth et al. | 713/400 |
| 6,665,202 B2 | 12/2003 | Lindahl et al. | 365/49 |
| 6,667,895 B2 | 12/2003 | Jang et al. | 365/63 |
| 6,675,117 B2 | 1/2004 | Adam et al. | 702/106 |
| 6,681,292 B2 | 1/2004 | Creta et al. | 711/119 |
| 6,697,926 B2 | 2/2004 | Johnson et al. | 711/167 |
| 6,715,018 B2 | 3/2004 | Farnworth et al. | 710/300 |

| | | | |
|---|---|---|---|
| 6,718,440 B2 | 4/2004 | Maiyuran et al. | 711/137 |
| 6,721,195 B2 | 4/2004 | Brunelle et al. | 365/63 |
| 6,724,685 B2 | 4/2004 | Braun et al. | 365/233 |
| 6,728,800 B1 | 4/2004 | Lee et al. | 710/54 |
| 6,732,203 B2 | 5/2004 | Kanapathippillai et al. | 710/66 |
| 6,735,679 B1 | 5/2004 | Herbst et al. | 711/167 |
| 6,735,682 B2 | 5/2004 | Segelken et al. | 711/220 |
| 6,745,275 B2 | 6/2004 | Chang | 710/305 |
| 6,751,703 B2 | 6/2004 | Chilton | 711/113 |
| 6,754,117 B2 | 6/2004 | Jeddeloh | 365/201 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,775,747 B2 | 8/2004 | Venkatraman | 711/137 |
| 6,782,465 B1 | 8/2004 | Schmidt | 711/208 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,811,320 B1 | 11/2004 | Abbott | 385/58 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,823,023 B1 | 11/2004 | Hannah | 375/296 |
| 6,832,306 B1 | 12/2004 | Ganapathy et al. | 712/41 |
| 6,845,409 B1 | 1/2005 | Talagala et al. | 710/20 |
| 6,880,117 B2 | 4/2005 | Lin et al. | 714/718 |
| 6,889,304 B2 | 5/2005 | Perego et al. | 711/170 |
| 6,910,109 B2 | 6/2005 | Holman et al. | 711/156 |
| 6,948,094 B2 | 9/2005 | Schultz et al. | 714/15 |
| 6,970,968 B1 | 11/2005 | Holman | 711/5 |
| 6,972,981 B2 | 12/2005 | Ruckerbauer et al. | 365/63 |
| 7,036,055 B2 | 4/2006 | Muljono et al. | 714/733 |
| 7,155,645 B1 | 12/2006 | Korhonen | 714/718 |
| 7,191,088 B1 | 3/2007 | Reed et al. | 702/130 |
| 7,216,196 B2 | 5/2007 | Jeddeloh | 711/5 |
| 7,310,748 B2 | 12/2007 | Jeddeloh | 714/42 |
| 7,310,752 B2 | 12/2007 | Jeddeloh | 714/718 |
| 7,360,011 B2 | 4/2008 | Jeddeloh | 711/5 |
| 7,516,363 B2 | 4/2009 | Jeddeloh | 714/31 |
| 7,584,336 B2 | 9/2009 | Tremaine | 711/155 |
| 2001/0013110 A1 | 8/2001 | Pierce et al. | 714/718 |
| 2001/0039612 A1 | 11/2001 | Lee | 713/2 |
| 2002/0013881 A1 | 1/2002 | Delp et al. | 711/105 |
| 2002/0023203 A1 | 2/2002 | Cofler et al. | 712/227 |
| 2002/0046379 A1 | 4/2002 | Miki et al. | 714/749 |
| 2002/0056063 A1 | 5/2002 | Nerl | 714/733 |
| 2002/0062466 A1 | 5/2002 | Noguchi | 714/738 |
| 2002/0066052 A1 | 5/2002 | Olarig et al. | 714/42 |
| 2002/0089925 A1 | 7/2002 | Smith et al. | 370/216 |
| 2002/0104043 A1 | 8/2002 | Reynolds et al. | 714/38 |
| 2002/0104045 A1 | 8/2002 | Cooper | 714/42 |
| 2002/0112119 A1 | 8/2002 | Halbert et al. | 711/115 |
| 2002/0116081 A1 | 8/2002 | Wood et al. | 700/87 |
| 2002/0116588 A1 | 8/2002 | Beckert et al. | 711/161 |
| 2002/0144064 A1 | 10/2002 | Fanning | 711/144 |
| 2002/0194558 A1 | 12/2002 | Wang et al. | 714/718 |
| 2002/0199136 A1 | 12/2002 | Ku | 714/30 |
| 2002/0199139 A1 | 12/2002 | Dortu et al. | 714/718 |
| 2003/0005223 A1 | 1/2003 | Coulson et al. | 711/118 |
| 2003/0043158 A1 | 3/2003 | Wasserman et al. | 345/545 |
| 2003/0043426 A1 | 3/2003 | Baker et al. | 359/109 |
| 2003/0046628 A1 | 3/2003 | Rankin et al. | 714/752 |
| 2003/0056038 A1 | 3/2003 | Cochran | 710/36 |
| 2003/0074601 A1 | 4/2003 | Schultz et al. | 714/15 |
| 2003/0093630 A1 | 5/2003 | Richard et al. | 711/154 |
| 2003/0149809 A1 | 8/2003 | Jensen et al. | 710/22 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0217223 A1 | 11/2003 | Nino, Jr. et al. | 711/105 |
| 2003/0227798 A1 | 12/2003 | Pax | 365/189.12 |
| 2003/0229770 A1 | 12/2003 | Jeddeloh | 711/213 |
| 2003/0233601 A1 | 12/2003 | Vaid et al. | 714/42 |
| 2004/0022094 A1 | 2/2004 | Radhakrishnan et al. | 365/200 |
| 2004/0044833 A1 | 3/2004 | Ryan | 711/5 |
| 2004/0122911 A1 | 6/2004 | Chong, Jr. et al. | 709/217 |
| 2004/0123043 A1 | 6/2004 | Rotithor et al. | 711/137 |
| 2004/0123180 A1 | 6/2004 | Soejima et al. | 714/5 |
| 2004/0126115 A1 | 7/2004 | Levy et al. | 398/116 |
| 2004/0128433 A1 | 7/2004 | Bains | 711/106 |
| 2004/0144994 A1 | 7/2004 | Lee et al. | 257/200 |
| 2004/0199843 A1 | 10/2004 | Hansquine et al. | 714/733 |
| 2004/0216018 A1 | 10/2004 | Cheung | 714/724 |
| 2004/0236885 A1 | 11/2004 | Fredriksson et al. | 710/100 |
| 2004/0237001 A1 | 11/2004 | Schulz et al. | 714/42 |
| 2005/0021884 A1 | 1/2005 | Jeddeloh | 710/22 |
| 2005/0044327 A1 | 2/2005 | Howard et al. | 711/147 |
| 2005/0060600 A1 | 3/2005 | Jeddeloh | 714/5 |
| 2005/0066113 A1 | 3/2005 | Rajamony et al. | 711/105 |
| 2005/0071542 A1 | 3/2005 | Weber et al. | 711/105 |
| 2005/0144403 A1 | 6/2005 | Jeddeloh | 711/154 |
| 2005/0210185 A1 | 9/2005 | Renick | 711/105 |
| 2005/0243829 A1 | 11/2005 | Spencer | 370/394 |
| 2005/0283681 A1 | 12/2005 | Jeddeloh | 714/42 |
| 2006/0075282 A1 | 4/2006 | Borkenhagen et al. | 714/5 |
| 2006/0206761 A1 | 9/2006 | Jeddeloh | 714/29 |
| 2007/0300105 A1 | 12/2007 | Jeddeloh | 714/718 |
| 2008/0140904 A1 | 6/2008 | Jeddeloh | 710/317 |

FOREIGN PATENT DOCUMENTS

| | | |
|---|---|---|
| JP | 2001265539 A | 9/2001 |
| KR | 2006/021440 A | 3/2006 |
| WO | WO 93/19422 | 9/1993 |
| WO | WO 02/27499 A2 | 4/2002 |

OTHER PUBLICATIONS

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (x72, ECC) 168-PIN Registered FBGA SDRAM DIMM", Micron Technology, Inc., 2002, pp. 1-23.

Shanley, T. et al., "PCI System Architecture", Third Edition, Mindshare, Inc., 1995, pp. 24-25.

SYSTEM AND METHOD FOR ON-BOARD DIAGNOSTICS OF MEMORY MODULES

CROSS-REFERENCE TO RELATED APPLICATIONS

This application is a continuation of U.S. patent application Ser. No. 11/901,486 filed Sep. 17, 2007, issued Apr. 7, 2009 as U.S. Pat. No. 7,516,363, which is a continuation of U.S. patent application Ser. No. 11/433,130, filed May 11, 2006, issued Oct. 2, 2007 as U.S. Pat. No. 7,278,060, which is a continuation of U.S. patent application Ser. No. 10/644,522, filed Aug. 19, 2003, issued Apr. 24, 2007 as U.S. Pat. No. 7,210,059 B2. These applications and patents are each incorporated by reference herein.

TECHNICAL FIELD

The present invention relates to a computer system, and more particularly, to a computer system having a memory module with a memory hub coupling several memory devices to a processor or other memory access devices.

BACKGROUND OF THE INVENTION

Computer systems use memory devices, such as dynamic random access memory ("DRAM") devices, to store instructions and data that are accessed by a processor. These memory devices are normally used as system memory in a computer system. In a typical computer system, the processor communicates with the system memory through a processor bus and a memory controller. The processor issues a memory request, which includes a memory command, such as a read command, and an address designating the location from which data or instructions are to be read. The memory controller uses the command and address to generate appropriate command signals as well as row and column addresses, which are applied to the system memory. In response to the commands and addresses, data is transferred between the system memory and the processor. The memory controller is often part of a system controller, which also includes bus bridge circuitry for coupling the processor bus to an expansion bus, such as a PCI bus.

Although the operating speed of memory devices has continuously increased, this increase in operating speed has not kept pace with increases in the operating speed of processors. Even slower has been the increase in operating speed of memory controllers coupling processors to memory devices. The relatively slow speed of memory controllers and memory devices limits the data bandwidth between the processor and the memory devices.

In addition to the limited bandwidth between processors and memory devices, the performance of computer systems is also limited by latency problems that increase the time required to read data from system memory devices. More specifically, when a memory device read command is coupled to a system memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SDRAM devices.

One approach to alleviating the memory latency and bandwidth problem is to use multiple memory devices coupled to the processor through a memory hub. In a memory hub architecture, a system controller or memory hub controller is coupled to several memory modules, each of which includes a memory hub coupled to several memory devices. The memory hub efficiently routes memory requests and responses between the controller and the memory devices. Computer systems employing this architecture can have a higher bandwidth because a processor can access one memory device while another memory device is responding to a prior memory access. For example, the processor can output write data to one of the memory devices in the system while another memory device in the system is preparing to provide read data to the processor. The operating efficiency of computer systems using a memory hub architecture can make it more practical to vastly increase memory capacity in computer systems.

Although there are advantages to utilizing a memory hub for accessing memory devices, the design of the hub memory system, and more generally, computer systems including such a memory hub architecture, becomes increasingly difficult. For example, in many hub based memory systems, the processor is coupled to the memory via a high speed bus or link over which signals, such as command, address, or data signals, are transferred at a very high rate. However, as transfer rates increase, the time for which a signal represents valid information is decreasing. As commonly referenced by those ordinarily skilled in the art, the window or "eye" for the signals decreases at higher transfer rates. With specific reference to data signals, the "data eye" decreases. As understood by one skilled in the art, the data eye for each of the data signals defines the actual duration that each signal is valid after various factors affecting the signal are considered, such as timing skew, voltage and current drive capability, and the like. In the case of timing skew of signals, it often arises from a variety of timing errors such as loading on the lines of the bus and the physical lengths of such lines.

As data eyes of the signals decrease at higher transfer rates, it is possible that one or more of a group of signals provided in parallel will have arrival times such that not all signals are simultaneously valid at a receiving entity, and thus cannot be successfully captured by that entity. For example, where a plurality of signals are provided in parallel over a bus, the data eye of one or more of the particular signals do not overlap with the data eyes of the other signals. In this situation, the signals having non-overlapping data eyes are not valid at the same time as the rest of the signals, and consequently, cannot be successfully captured by the receiving entity.

Clearly, as those ordinarily skilled in the art will recognize, the previously described situation is unacceptable. As it is further recognized by those familiar in the art of high speed digital systems, signal timing and signal integrity are issues that have become increasingly more significant in the design of systems capable of transferring and transmitting information at high speeds because signal characteristics can be affected by many things. As a result, diagnostic analysis and evaluation of signals, whether command, address, or data signals, is becoming a more critical step in the design process for any high-speed digital system. Examples of the types of issues evaluated through diagnostic testing include pattern sensitivity, power and ground sensitivity, voltage margin, signal interactions on a bus, failure analysis, and the like.

The tools typically used in performing diagnostics include logic analyzers, pattern generators, oscilloscopes, and in some cases, modified desktop computers. It will be appreciated that there are many other diagnostic tools that are available, however, one common feature shared by all of these tools is the relatively expensive cost. In many instances, only well funded companies can afford equipment with enough sophistication capable of performing diagnostics on high-speed systems. Often, smaller, less well funded companies must compromise performance of the diagnostic equipment in order to afford the equipment, thus, either making some diagnostic evaluation more difficult, or perhaps, even impossible.

Another issue that often arises with conventional diagnostic tools is the manner in which signals are detected by the diagnostic equipment. More specifically, probes of various sorts are used to couple signals from a signal line for detection by the diagnostic equipment. A problem resulting from this is that the probe can introduce loading effects that change the characteristic of the signal being evaluated. Although probes are specifically designed to have high impedance and low capacitance to minimize loading issues and the introduction of noise, there is still in many cases, an unacceptable level of loading that changes the character of a signal to such a degree that it cannot be accurately evaluated.

Another issue that is specific to performing diagnostics on a memory system is the difficulty associated with obtaining control over the memory bus in order to perform evaluation. The ability to evaluate a memory system often requires that specific signals of interest can be captured and analyzed by obtaining control of the memory bus and monitoring the interaction of the signal with the bus itself. Unless control over the memory bus can be obtained, analysis becomes a difficult task. However, obtaining control over the memory bus is a difficult task in itself because conventional approaches often interfere with the normal operation of the computer system, thus, preventing accurate analysis of the memory system under true, normal operating conditions.

Therefore, there is a need for alternative approaches to performing diagnostic analysis and evaluation on memory modules, including those memory modules for use in a memory hub architecture.

SUMMARY OF THE INVENTION

The present invention is directed to a memory hub having an on-board diagnostic engine through which diagnostic testing and evaluation of the memory system can be performed. The memory hub includes a link interface for receiving memory requests for access to memory devices of the memory system and a memory device interface coupled to the memory devices for coupling memory requests to the memory devices for access to at least one of the memory devices. A switch for selectively coupling the link interface and the memory device interface is further included, and a memory hub diagnostic engine is coupled to the switch for coupling control signals to the link interface and the memory device interface to perform diagnostic testing of the memory system. The diagnostic engine includes a maintenance port that provides access to results of the diagnostic testing and through which diagnostic testing commands can be received.

DETAILED DESCRIPTION OF THE INVENTION

Embodiments of the present invention are directed to a system memory having memory modules with on-board diagnostics and self-testing capability. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
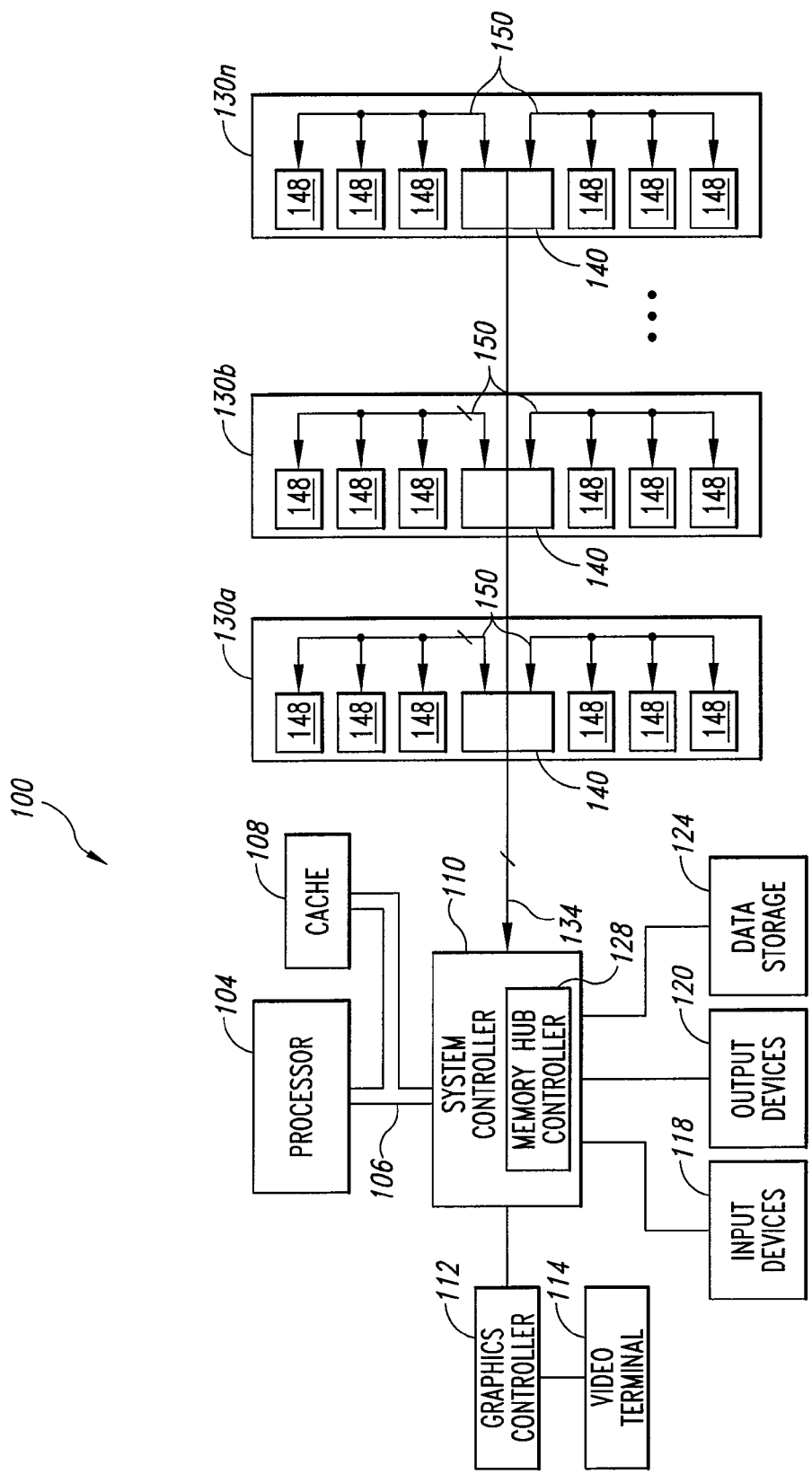
FIG. 1 is a block diagram of a computer system having memory modules in a memory hub architecture in which embodiments of the present invention can be implemented.

A computer system 100 according to one embodiment of the invention is shown in FIG. 1. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, is typically static random access memory ("SRAM"). Finally, the processor bus 106 is coupled to a system controller 110, which is also sometimes referred to as a "North Bridge" or "memory controller."

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 includes a memory hub controller 128 that is coupled to several memory modules 130a,b . . . n, which serve as system memory for the computer system 100. The memory modules 130 are preferably coupled to the memory hub controller 128 through a high-speed link 134, which may be an optical or electrical communication path or some other type of communications path. In the event the high-speed link 134 is implemented as an optical communication path, the optical communication path may be in the form of one or more optical fibers. In such case, the memory hub controller 128 and the memory modules will include an optical input/output port or separate input and output ports coupled to the optical communication path. The memory modules 130 are shown coupled to the memory hub controller 128 in a point-to-point arrangement in which the single high-speed link 134 is coupled to all of the memory modules 130. However, it will be understood that other topologies may also be used, such as a point-to-point coupling arrangement in which a separate high-speed link (not shown) is used to couple each of the memory modules 130 to the memory hub controller 128. A switching topology may also be used in which the memory hub controller 128 is selectively coupled to each of the memory modules 130 through a switch (not shown). Other topologies that may be used will be apparent to one skilled in the art.

Each of the memory modules 130 includes a memory hub 140 for controlling access to a plurality of memory devices 148, which, in the example illustrated in FIG. 1, are synchronous dynamic random access memory ("SDRAM") devices. Although shown in FIG. 1 as having six memory devices 148, a fewer or greater number of memory devices 148 may be used, and memory devices other than SDRAM devices may also be used. For example, in an alternative embodiment of the present invention, a memory module includes a memory hub for controlling between nine and eighteen memory devices. The memory hub 140 is coupled to each of the system memory devices 148 through a bus system 150, which normally includes a control bus, an address bus, and a data bus.

Figure 2:
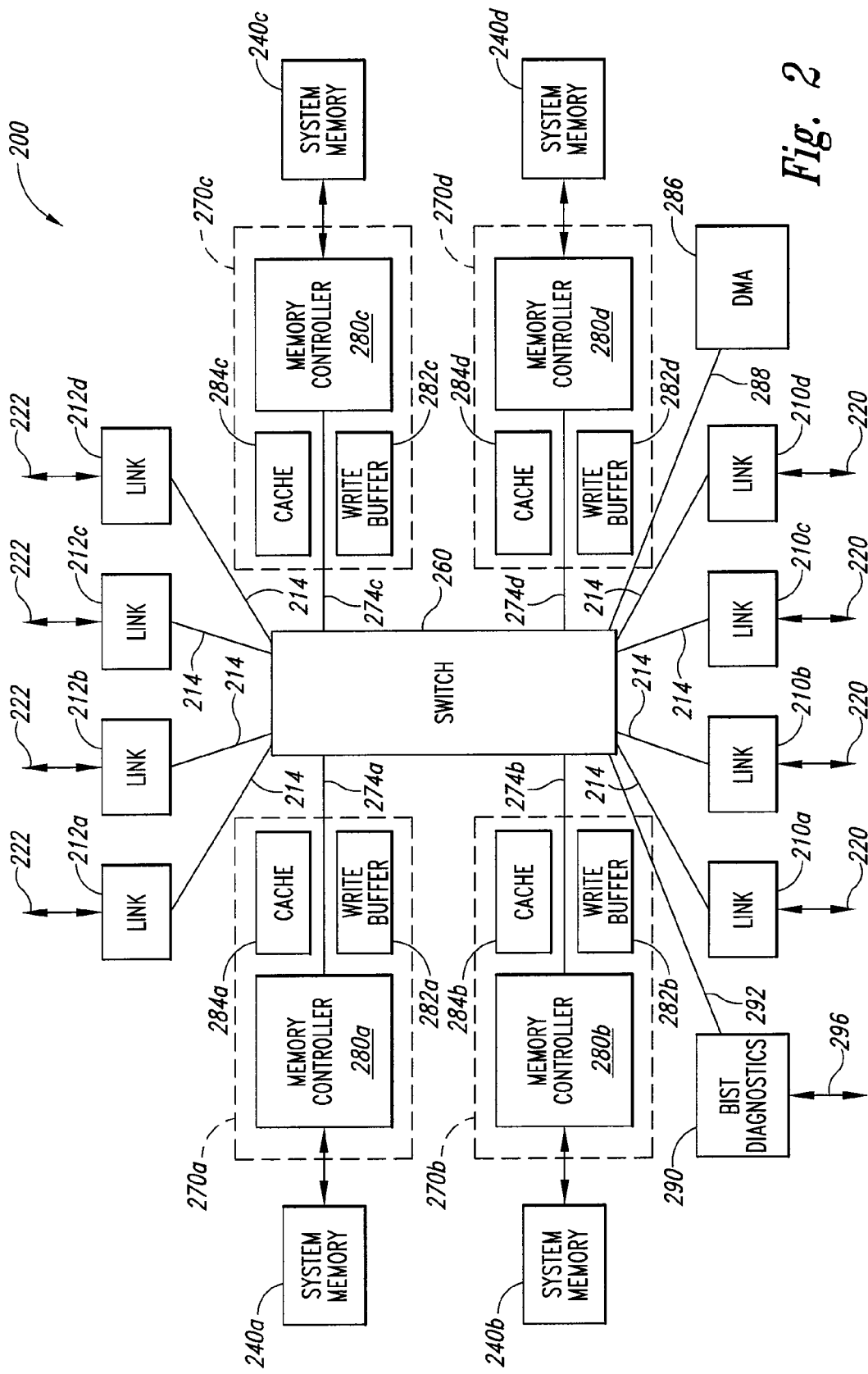
FIG. 2 is a block diagram of a memory hub according to an embodiment of the present invention for use with the memory modules in the computer system of FIG. 1.

A memory hub 200 according to an embodiment of the present invention is shown in FIG. 2. The memory hub 200 can be substituted for the memory hub 140 of FIG. 1. The memory hub 200 is shown in FIG. 2 as being coupled to four memory devices 240*a-d*, which, in the present example are conventional SDRAM devices. Examples of conventional SDRAM devices include multiple data rate memory devices, such as double data rate (DDR) devices, DDR II and DDR III devices, and the like. In an alternative embodiment, the memory hub 200 is coupled to four different banks of memory devices, rather than merely four different memory devices 240*a-d*, with each bank typically having a plurality of memory devices. However, for the purpose of providing an example, the present description will be with reference to the memory hub 200 coupled to the four memory devices 240*a-d*. It will be appreciated that the necessary modifications to the memory hub 200 to accommodate multiple banks of memory is within the knowledge of those ordinarily skilled in the art.

Further included in the memory hub 200 are link interfaces 210*a-d* and 212*a-d* for coupling the memory module on which the memory hub 200 is located to a first high speed data link 220 and a second high speed data link 222, respectively. As previously discussed with respect to FIG. 1, the high speed data links 220, 222 can be implemented using an optical or electrical communication path or some other type of communication path. The link interfaces 210*a-d*, 212*a-d* are conventional, and include circuitry used for transferring data, command, and address information to and from the high speed data links 220, 222. As well known, such circuitry includes transmitter and receiver logic known in the art. It will be appreciated that those ordinarily skilled in the art have sufficient understanding to modify the link interfaces 210*a-d*, 212*a-d* to be used with specific types of communication paths, and that such modifications to the link interfaces 210*a-d*, 212*a-d* can be made without departing from the scope of the present invention. For example, in the event the high-speed data link 220, 222 is implemented using an optical communications path, the link interfaces 210*a-d*, 212*a-d* will include an optical input/output port that can convert optical signals coupled through the optical communications path into electrical signals.

The link interfaces 210*a-d*, 212*a-d* are coupled to the a switch 260 through a plurality of bus and signal lines, represented by busses 214. The busses 214 are conventional, and include a write data bus and a read data bus, although a single bi-directional data bus may alternatively be provided to couple data in both directions through the link interfaces 210*a-d*, 212*a-d*. It will be appreciated by those ordinarily skilled in the art that the busses 214 are provided by way of example, and that the busses 214 may include fewer or greater signal lines, such as further including a request line and a snoop line, which can be used for maintaining cache coherency.

The link interfaces 210*a-d*, 212*a-d* include circuitry that allow the memory hub 140 to be connected in the system memory in a variety of configurations. For example, the point-to-point arrangement, as shown in FIG. 1, can be implemented by coupling each memory module to the memory hub controller 128 through either the link interfaces 210*a-d* or 212*a-d*. Alternatively, another configuration can be implemented by coupling the memory modules in series. For example, the link interfaces 210*a-d* can be used to couple a first memory module and the link interfaces 212*a-d* can be used to couple a second memory module. The memory module coupled to a processor, or system controller, will be coupled thereto through one set of the link interfaces and further coupled to another memory module through the other set of link interfaces. In one embodiment of the present invention, the memory hub 200 of a memory module is coupled to the processor in an arrangement in which there are no other devices coupled to the connection between the processor 104 and the memory hub 200. This type of interconnection provides better signal coupling between the processor 104 and the memory hub 200 for several reasons, including relatively low capacitance, relatively few line discontinuities to reflect signals and relatively short signal paths.

The switch 260 is further coupled to four memory interfaces 270*a-d* which are, in turn, coupled to the system memory devices 240*a-d*, respectively. By providing a separate and independent memory interface 270*a-d* for each system memory device 240*a-d*, respectively, the memory hub 200 avoids bus or memory bank conflicts that typically occur with single channel memory architectures. The switch 260 is coupled to each memory interface through a plurality of bus and signal lines, represented by busses 274. The busses 274 include a write data bus, a read data bus, and a request line. However, it will be understood that a single bi-directional data bus may alternatively be used instead of a separate write data bus and read data bus. Moreover, the busses 274 can include a greater or lesser number of signal lines than those previously described.

In an embodiment of the present invention, each memory interface 270*a-d* is specially adapted to the system memory devices 240*a-d* to which it is coupled. More specifically, each memory interface 270*a-d* is specially adapted to provide and receive the specific signals received and generated, respectively, by the system memory device 240*a-d* to which it is coupled. Also, the memory interfaces 270*a-d* are capable of operating with system memory devices 240*a-d* operating at different clock frequencies. As a result, the memory interfaces 270*a-d* isolate the processor 104 from changes that may occur at the interface between the memory hub 230 and memory devices 240*a-d* coupled to the memory hub 200, and it provides a more controlled environment to which the memory devices 240*a-d* may interface.

The switch 260 coupling the link interfaces 210*a-d*, 212*a-d* and the memory interfaces 270*a-d* can be any of a variety of conventional or hereinafter developed switches. For example, the switch 260 may be a cross-bar switch that can simultaneously couple link interfaces 210*a-d*, 212*a-d* and the memory interfaces 270*a-d* to each other in a variety of arrangements. The switch 260 can also be a set of multiplexers that do not provide the same level of connectivity as a cross-bar switch but nevertheless can couple the some or all of the link interfaces 210*a-d*, 212*a-d* to each of the memory interfaces 270*a-d*. The switch 260 may also includes arbitration logic (not shown) to determine which memory accesses should receive priority over other memory accesses. Bus arbitration performing this function is well known to one skilled in the art.

With further reference to FIG. 2, each of the memory interfaces 270*a-d* includes a respective memory controller 280, a respective write buffer 282, and a respective cache memory unit 284. The memory controller 280 performs the same functions as a conventional memory controller by providing control, address and data signals to the system memory device 240a-d to which it is coupled and receiving data signals from the system memory device 240a-d to which it is coupled. The write buffer 282 and the cache memory unit 284 include the normal components of a buffer and cache memory, including a tag memory, a data memory, a comparator, and the like, as is well known in the art. The memory devices used in the write buffer 282 and the cache memory unit 284 may be either DRAM devices, static random access memory ("SRAM") devices, other types of memory devices, or a combination of all three. Furthermore, any or all of these memory devices as well as the other components used in the cache memory unit 284 may be either embedded or stand-alone devices.

The write buffer 282 in each memory interface 270a-d is used to store write requests while a read request is being serviced. In a such a system, the processor 104 can issue a write request to a system memory device 240a-d even if the memory device to which the write request is directed is busy servicing a prior write or read request. Using this approach, memory requests can be serviced out of order since an earlier write request can be stored in the write buffer 282 while a subsequent read request is being serviced. The ability to buffer write requests to allow a read request to be serviced can greatly reduce memory read latency since read requests can be given first priority regardless of their chronological order. For example, a series of write requests interspersed with read requests can be stored in the write buffer 282 to allow the read requests to be serviced in a pipelined manner followed by servicing the stored write requests in a pipelined manner. As a result, lengthy settling times between coupling write request to the memory devices 270a-d and subsequently coupling read request to the memory devices 270a-d for alternating write and read requests can be avoided.

The use of the cache memory unit 284 in each memory interface 270a-d allows the processor 104 to receive data responsive to a read command directed to a respective system memory device 240a-d without waiting for the memory device 240a-d to provide such data in the event that the data was recently read from or written to that memory device 240a-d. The cache memory unit 284 thus reduces the read latency of the system memory devices 240a-d to maximize the memory bandwidth of the computer system. Similarly, the processor 104 can store write data in the cache memory unit 284 and then perform other functions while the memory controller 280 in the same memory interface 270a-d transfers the write data from the cache memory unit 284 to the system memory device 240a-d to which it is coupled.

Further included in the memory hub 200 is a built in self-test (BIST) and diagnostic engine 290 coupled to the switch 260 through a diagnostic bus 292. The diagnostic engine 290 is further coupled to a maintenance bus 296, such as a System Management Bus (SMBus) or a maintenance bus according to the Joint Test Action Group (JTAG) and IEEE 1149.1 standards. Both the SMBus and JTAG standards are well known by those ordinarily skilled in the art. Generally, the maintenance bus 296 provides a user access to the diagnostic engine 290 in order to perform memory channel and link diagnostics. For example, the user can couple a separate PC host via the maintenance bus 296 to conduct diagnostic testing or monitor memory system operation. By using the maintenance bus 296 to access diagnostic test results, issues related to the use of test probes, as previously discussed, can be avoided. It will be appreciated that the maintenance bus 296 can be modified from conventional bus standards without departing from the scope of the present invention. It will be further appreciated that the diagnostic engine 290 should accommodate the standards of the maintenance bus 296, where such a standard maintenance bus is employed. For example, the diagnostic engine should have an maintenance bus interface compliant with the JTAG bus standard where such a maintenance bus is used.

Further included in the memory hub 200 is a DMA engine 286 coupled to the switch 260 through a bus 288. The DMA engine 286 enables the memory hub 200 to move blocks of data from one location in the system memory to another location in the system memory without intervention from the processor 104. The bus 288 includes a plurality of conventional bus lines and signal lines, such as address, control, data busses, and the like, for handling data transfers in the system memory. Conventional DMA operations well known by those ordinarily skilled in the art can be implemented by the DMA engine 286. A more detailed description of a suitable DMA engine can be found in commonly assigned, co-pending U.S. patent application Ser. No. 10/625,132, entitled APPARATUS AND METHOD FOR DIRECT MEMORY ACCESS IN A HUB-BASED MEMORY SYSTEM, filed on Jul. 22, 2003, which is incorporated herein by reference. As described in more detail in the aforementioned patent application, the DMA engine 286 is able to read a link list in the system memory to execute the DMA memory operations without processor intervention, thus, freeing the processor 104 and the bandwidth limited system bus from executing the memory operations. The DMA engine 286 can also include circuitry to accommodate DMA operations on multiple channels, for example, for each of the system memory devices 240a-d. Such multiple channel DMA engines are well known in the art and can be implemented using conventional technologies.

The diagnostic engine 290 and the DMA engine 286 are preferably embedded circuits in the memory hub 200. However, including separate a diagnostic engine and a separate DMA device coupled to the memory hub 200 is also within the scope of the present invention.

Embodiments of the present invention provide an environment for investigating new memory interface and high speed link technology, such as that previously discussed with respect to FIGS. 1 and 2. Embodiments of the present invention can be further used to provide continuous reliability data, as well as gathering error rate or margin data which can be evaluated by the host in determining appropriate action to be taken. This environment creates a rapid proto-typing capability for new memory technology. Diagnostic evaluation of the memory system can be performed and monitored at the overall system level, as well as at the memory module level. That is, in addition to evaluating overall memory system performance, access to each individual memory module can be made through the respective maintenance bus to perform diagnostic testing of each memory module, thus, providing information for individual memory module performance.

The diagnostic engine 290, link interfaces 210a-d, 212a-d, the DMA engine 286, the maintenance bus 296 and hardware instrumentation provide a fully automated memory module test vehicle. In embodiments of the present invention, a user is able to access pattern generation and interface synchronization logic contained in the memory hub 200 through the diagnostic engine 290 to perform automated testing and diagnostic evaluation of memory device address eyes, data eyes, voltage margin, high speed hub-to-hub (link) interfaces, and boundary scans. For example, the memory modules 130 (FIG. 1) can be directed to execute built in self-tests upon power up of the computer system 100. The results of the self-test can be accessed through the maintenance bus 296 and the diagnostic engine 290. Additionally, further testing or diagnostics can be performed by user access of the diagnostic engine 290 through the maintenance bus 296 to further investigate any issues. The system under test, or a separate PC host, can perform additional tests to verify or debug any memory issues.

Additionally, as previously discussed, a user can access transmitter and receiver logic of the link interfaces 210, 212, which allows for control over the memory bus to be obtained. Such control can be used to monitor interface calibration or be used as a manual override for calibration when desired. As a result, a user can potentially debug the memory bus without a high speed logic analyzer and scope. Moreover, the transmitters and receivers of the memory interfaces 270 and the link interfaces 210, 212 can be monitored or driven through the maintenance bus 296 and diagnostic engine 290 by using debug software. For example, the transmitter drive strength and slew rate can be controlled. The receiver filter coefficients and clock placement can also be controlled. For the purpose of performing diagnostics, resulting evaluation data can be fed to a graphical user interface to display signal quality.

The DMA engine 286 can also be used for running diagnostics in the system. For example, known good data patterns can be loaded in memory of the memory hub 200, or known good system memory, and used to test the system memory. In alternative embodiments of the present invention, the DMA engine 286 is further capable of generating desired memory bus or link access patterns. Additionally, the DMA engine 286 has random request spacing, address and data pattern capability, and can be operated in a very controlled or a random mode. The DMA engine 286 can be delegated the responsibility for generating requests to the memory controllers 280 or link interfaces 210, 212 and checking the return data. The DMA engine 286 can further include various data buffers to store trace history, which can be accessed through the maintenance bus 296 and the diagnostic engine 290 to be evaluated by the user.

Figure 3:
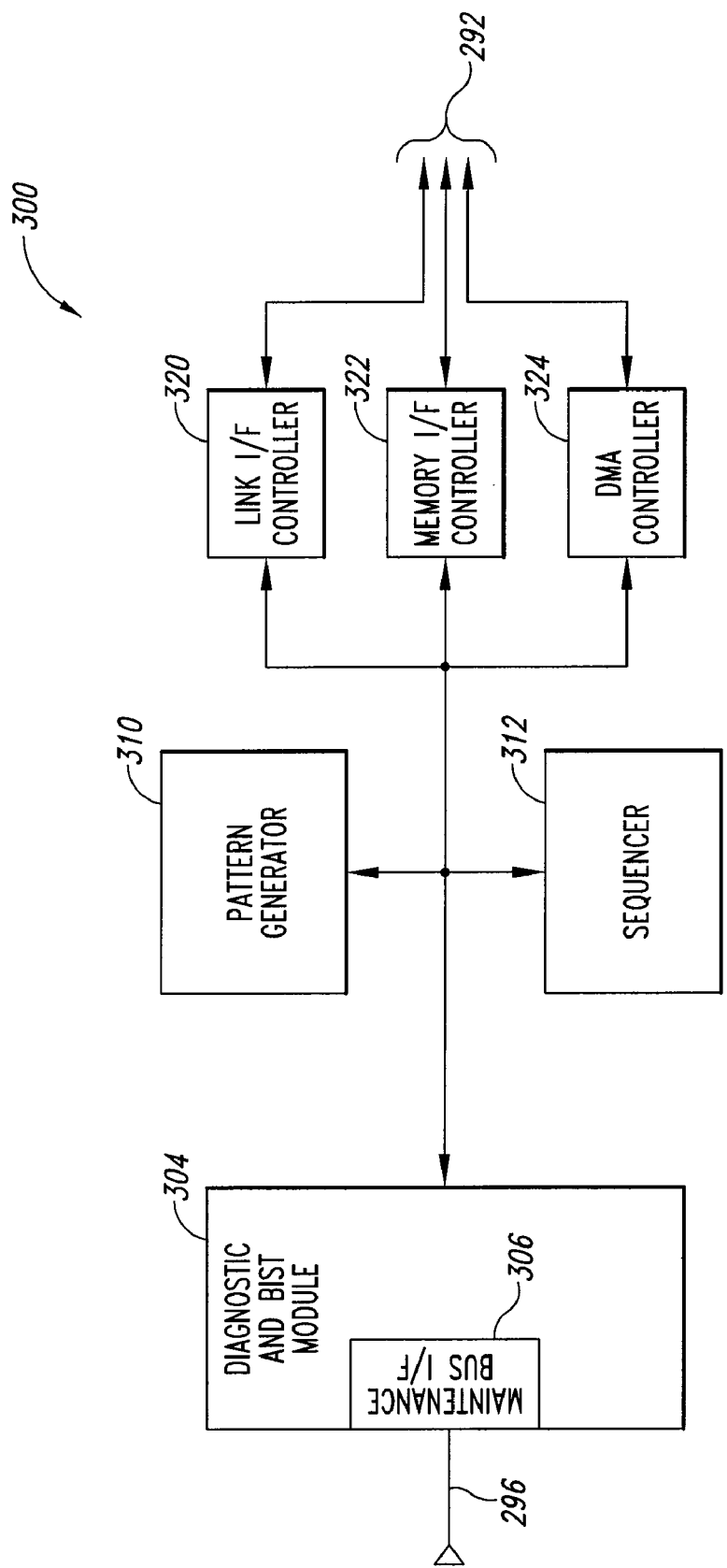
FIG. 3 is a block diagram of a diagnostic engine according to an embodiment of the present invention.

FIG. 3 illustrates a diagnostic engine 300 according to an embodiment of the present invention. The diagnostic engine 300 can be substituted for the diagnostic engine 296 of FIG. 2. It will be appreciated that FIG. 3 is a functional block diagram representative of a suitable diagnostic engine, and is not intended to limit the scope of the present invention. The functional blocks shown in FIG. 3 are conventional, and can be implemented using well known techniques and circuitry. It will be further appreciated that control signals and other functional blocks have been omitted from FIG. 3 in order to avoid unnecessarily obscuring the present invention, and that the description provided herein is sufficient to enable those ordinarily skilled in the art to practice the invention.

Included in the diagnostic engine 300 is a diagnostic and BIST module 304 coupled to the maintenance bus 296 through a maintenance bus interface 306, through which the diagnostic engine 300 receives command and data signals from a user and through which the results of diagnostic testing can be accessed. A pattern generator 310 and sequencer 312 are coupled to the diagnostic and BIST module 304 for generating test patterns used for testing and diagnostic analysis and for translating commands provided to the diagnostic and BIST module 304 into memory commands applied to the system memory 240 (FIG. 2). Further coupled to the diagnostic and BIST module 304, as well as to the pattern generator 310 and the sequencer 312, are link interface controller 320, memory interface controller 322, and DMA controller 324. Each of the controllers 320, 322, 324 are coupled to the switch 260 through the diagnostic bus 292.

In operation, the diagnostic and BIST module 304 receives command and data signals through the maintenance bus 296 from a user. In response, the diagnostic and BIST module 304 generates control signals and forwards the user supplied command and data signals to carry out the commands of the user. For example, the diagnostic and BIST module 304 may invoke the pattern generator 310 to begin generating a test pattern in accordance with the user's commands and data, and also forward the user provided memory commands to the sequencer for translation into control signals that will be applied to the system memory 240 to carry out diagnostic memory operations. Based on the type of commands and data provided by the user, that is, the type of testing or diagnostic that will be performed, control signals are provided over the diagnostic bus 292 to the switch 260 and onto the appropriate memory hub functional blocks using the controllers 320, 322, 324. For example, as previously described, a user can monitor the link interface calibration and manually override the calibration by providing commands to the diagnostic engine through the maintenance bus 296. In such an instance, the diagnostic and BIST module 304 receives the user provided commands, and accesses the specified link interfaces 210, 212 through the link interface controller 320 and the switch 260 to monitor and adjust the link interface calibration.

It will be appreciated that the previous description of the memory hub 200 (FIG. 2) and the diagnostic engine 300 (FIG. 3) have been provided by way of example, and modifications to the memory hub 200 and the diagnostic engine can be made without departing from the scope of the present invention. For example, the previously described embodiments of the memory hub 200 includes a DMA engine 286. However, in alternative embodiments, a DMA engine is not present in the memory hub, and memory operations are performed under the command of the processor 104 (FIG. 1) or the memory hub controller 128 instead. In another embodiment, the diagnostic engine 296 further includes self-testing and repair capabilities, such as those described in commonly assigned, co-pending U.S. patent application Ser. No. 10/222,393, entitled SYSTEM AND METHOD FOR SELF-TESTING AND REPAIR OF MEMORY MODULES, filed Aug. 16, 2002, which is incorporated herein by reference.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A system comprising:
a plurality of memory systems, each of the memory systems including a respective plurality of memory devices and logic coupled to the memory devices, the logic comprising:
a memory device interface configured to provide signals to the memory devices and receive signals from the memory devices;
a diagnostic test engine coupled to the memory device interface and configured to receive diagnostic testing commands and monitor memory system operation while at least one of the memory devices is operating; and
a direct memory access (DMA) engine coupled to the diagnostic test engine, the DMA engine operable to retrieve and load data patterns for testing into the logic.

2. The system of claim 1 wherein the DMA engine is configured to store signal trace history for at least one of the signals sent to the memory devices for retrieval through the host computer system interface.

3. A system comprising:
a plurality of memory systems coupled to a link on which signals are transmitted, each of the memory systems including:
a plurality of memory devices and logic coupled to the memory devices, the logic comprising:

a plurality of link interfaces coupled to the link, the link interfaces configured to transmit and receive control, address and data signals on the link;

a diagnostic test engine coupled to the link interface and configured to receive diagnostic testing commands and provide diagnostic testing results, the diagnostic test engine configured to monitor memory system operation and provide results from monitoring the memory system operation to a host computer system as diagnostic testing results; and a direct memory access (DMA) engine coupled to the diagnostic test engine, the DMA engine operable to retrieve and load data patterns for testing into the logic.

4. The system of claim 3 wherein the DMA Engine is further configured to store signal trace history for monitored memory system operation for retrieval through the host computer system interface.

* * * * *